May 17, 1960 M. J. PIFER 2,936,631

TUNING MECHANISM

Filed Sept. 16, 1957 4 Sheets-Sheet 1

INVENTOR
MARION J. PIFER
BY
Robert E. Strauss
ATTORNEY

INVENTOR
MARION J. PIFER
BY
Robert E. Stanson
ATTORNEY

May 17, 1960 M. J. PIFER 2,936,631

TUNING MECHANISM

Filed Sept. 16, 1957 4 Sheets-Sheet 3

INVENTOR
MARION J. PIFER
BY Robert E. Strausser
ATTORNEY

INVENTOR
MARION J. PIFER
BY
Robert E. Strauss
ATTORNEY 2,936,631

TUNING MECHANISM

Marion J. Pifer, Williamsville, N.Y., assignor, by mesne assignments, to Sylvania Electric Products Inc., Wilmington, Del., a corporation of Delaware Application September 16, 1957, Serial No. 684,102

1 Claim. (Cl. 74—10.5)

This invention relates to drive mechanisms and more particularly to devices of this type which are adapted to control or tune electrical apparatus.

Drive mechanisms employed in electrical devices such as radio and television receivers to provide channel selection and tuning usually comprise a number of complicated sub-assembles which are large and unwieldy, expensive to fabricate and difficult to assemble and disassemble. These disadvantages are magnified with the introduction of features which require that multiple step tuning be employed with customer controls located at a position which is remote from the location of the tuners utilized in such receivers.

Accordingly, an object of the invention is to reduce the aforementioned disadvantages and to facilitate fabrication of a relatively inexpensive, compact, efficient tuning mechanism for electrical devices.

A further object is to provide multiple step reversible channel selection or tuning for electrical devices.

The foregoing objects are achieved in one aspect of the invention by the provision of a tuning mechanism adapted to control a plurality of tuners, e.g. the very high frequency (V.H.F.) and ultra high frequency (U.H.F.) units of a television receiver. This mechanism includes concentric shafts connected to the V.H.F. tuner and a coupling interconnecting the outer concentric shaft with the U.H.F. tuner. Reversible ratchet means are provided to drive the inner shaft and thereby control channel selection of the V.H.F. tuner. A gear arrangement is employed to rotate the outer shaft for the purpose of controlling the V.H.F. fine tuning in addition to providing the conventional continuous channel selection or tuning for V.H.F. frequencies.

For a better understanding of the invention, reference is made to the following description taken in conjunction with the accompanying drawings in which.

Figure 1:
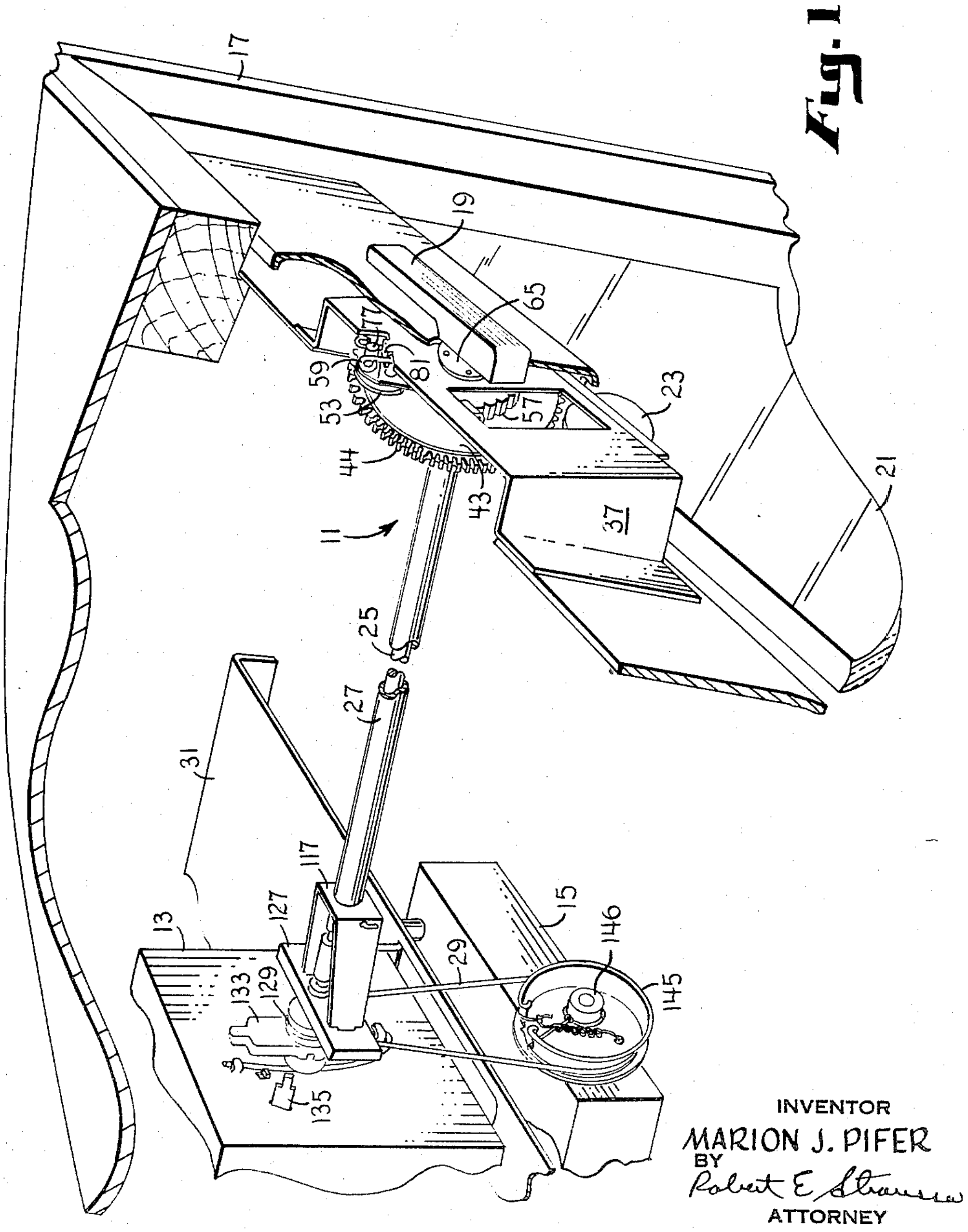
Fig. 1 is a perspective view of one portion of a television apparatus.
Figure 2:
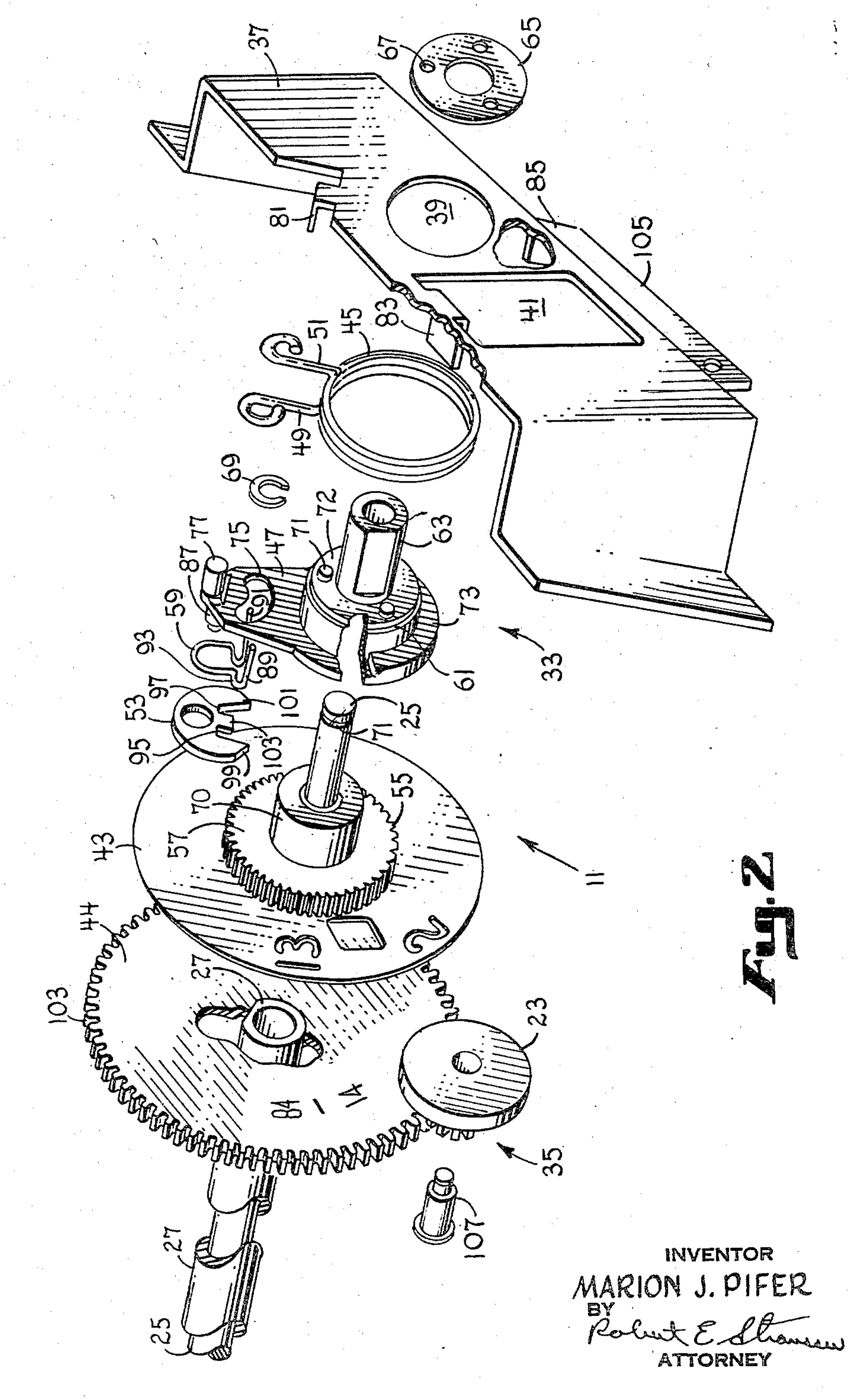
Fig. 2 is an exploded view of a drive mechanism adapted to operate in conjunction with television receiver tuner units.

Referring to Fig. 1, a tuning drive mechanism 11 is illustrated in conjunction with a television receiver employing a very high frequency (V.H.F.) tuner 13 and an ultra high frequency (U.H.F.) tuner 15. Mechanism 11 is positioned upon cabinet 17 so that the customer tuning control arm 19 is disposed above face plate 21 of the receiver. Manipulation of control arm 19 and knob 23 causes rotation of concentric drive shafts 25 and 27 respectively to provide the tuning movements for units 13 and 15. Control arm 19 is connected to the inner shaft 25 to regulate V.H.F. channel selection whereas knob 23 operates upon the outer shaft 27 to provide fine tuning adjustment for V.H.F. in addition to controlling the frequency selection of U.H.F. tuner 15 by movement of coupling 29. The tuners are affixed to mounting plate 31 near the back portions of cabinet 17 to provide easy access for servicing.

Figs. 2 through 6 show in detail the ratchet device 33 and gear drive apparatus 35 which function to impart rotation to the inner shaft 25 and outer shaft 27 respectively. A bracket 37 is mounted upon cabinet 17 to provide the front positioning element for mechanism 11. The bracket has an opening 39 and a window 41 formed therein to facilitate observation of the channel numerals printed on the V.H.F. and U.H.F. dials 43 and 44. If desired, the numerals may be projected onto a screen positioned over window 41.

Ratchet device 33 is shown comprising a ratchet spring 45, which is trapped in position between ratchet actuating or lever arm 47 and the back surface of bracket 37. Spring 45 is formed as a helix with a pair of crossed arms 49 and 51 extending therefrom which are adapted to operate upon lever arm 47 to return control 19 and arm 47 to a normal position after each multiple step tuning operation. Motion is imparted to the V.H.F. drive shaft 25 by means of the engagement between pawl 53 and the gear teeth 55 formed on ratchet wheel 57. A pawl spring or biasing means 59 is formed to operate upon pawl 53 to cause engagement with gear teeth 55 in either a clockwise or counter-clockwise direction in accordance with the direction of movement of control arm 19.

Shoulder 61 of lever arm 47 seats against the internal peripheral surface of opening 39 in bracket 37 so that cylinder 63 extends beyond the bracket for cooperation with control arm 19. The lever arm is affixed to the bracket by means of a bearing washer 65 which is disposed on the opposite side of bracket 37 and is formed with apertures 67 through which rivets 71 extend. Shaft 25 is threaded through cylinder 63 and is affixed thereto by means of the clamping effect of clip 69 within groove 71. The hub 70 of ratchet wheel 57 is inserted into barrel 72 of actuating arm 47. Ratchet actuating or lever arm 47 is provided with a spacing block 73 which serves to maintain spring 45 at a position intermediate the opposed surfaces of the lever arm and bracket 37. The upper portion of lever arm 47 is formed to provide an elongated curvilinear slot 75 and a pin 77 which extends from the forward surface of the arm. The pin is disposed intermediate ratchet spring arms 49 and 51 so that rotation of the lever 47 will cause ratchet spring 45 to be compressed by virtue of the action of pin 77 upon, for instance, arm 49. The other ratchet spring arm 51 is maintained in a stationary position during rotation of lever 47 by means of its abutting relationship with ratchet centering lug 81. Consequently, when ratchet control 19 is rotated, for example, in the counterclockwise direction, movement of lever arm 47 causes pin 77 to press against arm 49 to compress spring 45 since arm 51 is maintained at its normal position by centering lug 81. After control 19 has been released, the spring will return arm 49 to its abbuting relationship with lug 81, thereby returning lever arm 47 to the initial position.

Bracket 37 is provided with stop plates 83 and 85 which serve to limit the travel of lever arm 47 in the counterclockwise and clockwise directions respectively. These stop plates are positioned so that V.H.F. channel selection may be made, for instance, in multiple steps of two positions in the counterclockwise direction and multiple steps of three positions in the clockwise direction. Such an arrangement facilitates multiple step selection of V.H.F. frequencies by a single rotational movement of control 19.

Ratchet actuating or lever arm 47 has a lug 87 disposed opposite pin 77 to position pawl spring or biasing means 59 and pawl 53 thereon. The pawl spring has longitudinally extending legs 89 and 91 which are formed to extend through slot 75. Each leg has a knee 93 adapted to be disposed within depressions 95 and 97 formed in pawl 53 intermediate the pawl teeth 99 and 101 and the stud 103. Pawl spring legs 89 and 91 extend beyond ratchet spring arms 49 and 51, which serve to confine these legs and normally maintain spring 59 in compression. Accordingly, when lever arm 47 is rotated in a given direction, e.g. clockwise, the pin 77 operates upon arm 51 to cause it to move away from lug 81. Leg 89 of the pawl spring is therefore no longer pressed inwardly by ratchet spring arm 49. Since the pawl spring tends to move legs 89 and 91 apart, the pawl 53 is pivoted by virtue of the action of leg 91 and knee 93 upon the surface of the pawl which defines depression 95. This pivoting motion causes pawl tooth 101 to engage with gear teeth 55, which in turn causes rotation of ratchet wheel 57 and the inner shaft 25.

Figures 3, 4, 5, 6:
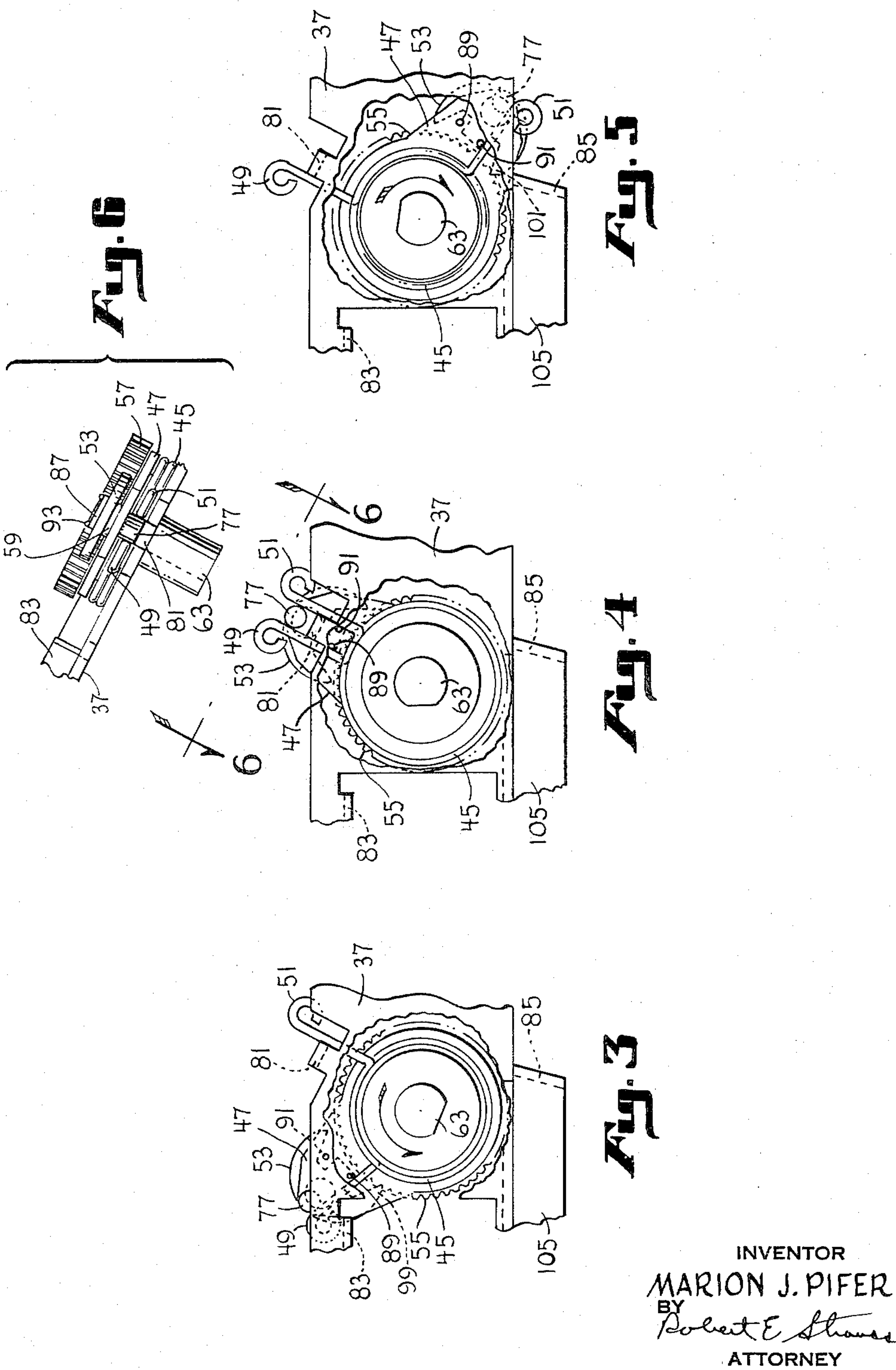
Figs. 3, 4 and 5 illustrate several positions of the drive mechanism shown in Fig. 2.
Fig. 6 is a top view of the device shown in Fig. 4.
Figure 7:
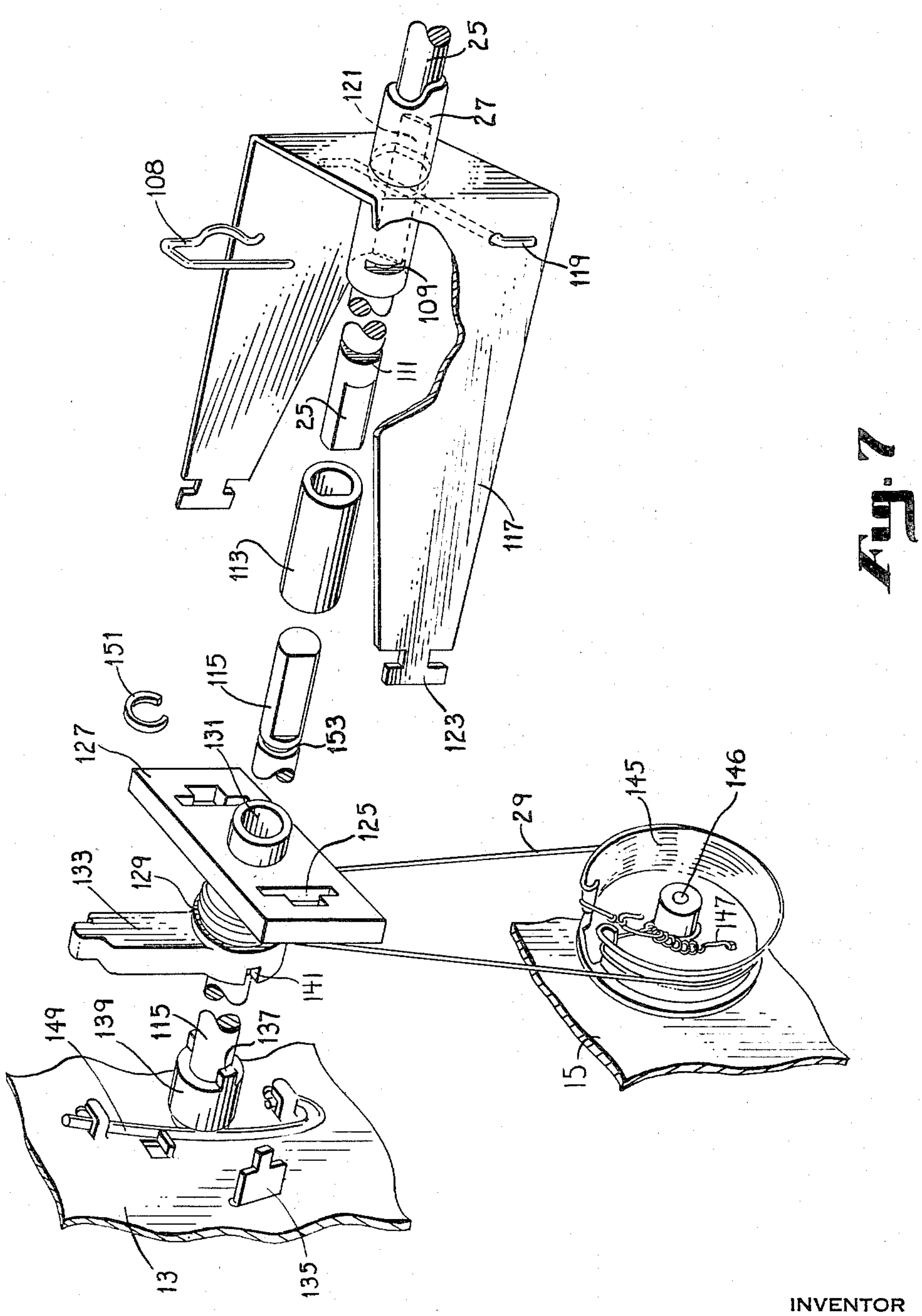
Fig. 7 is an exploded view illustrating the apparatus which connects the tuners employed in a television receiver with that portion of the drive mechanism illustrated in Fig. 2.

Referring particularly to Figs. 3 through 6 inclusive, it can be seen that arms 49 and 51 normally press against pin 77 and centering lug 81 and that legs 89 and 91 of pawl spring 59 are depressed between legs 49 and 51 to maintain the pawl 53 at its initial or normal position, Fig. 4. When control arm 19 is rotated in a counterclockwise direction, Fig. 3, lever arm 47 causes ratchet spring arm 49 to move away from lug 81 to thereby release the pressure on pawl spring leg 91 since it is no longer pressing against arm 51. This causes knee 93 on leg 89 to pivot pawl 53 so that tooth 99 becomes engaged with gear teeth 55 to thereby cause rotation of ratchet wheel 57 and inner shaft 25. The limit of counter-clockwise ratchet movement is shown in Fig. 3 at that position whereat arm 47 abuts stop plate 83. When control arm 19 is released, ratchet spring arm 49 forces lever arm 47 back to the central position shown in Fig. 4 as tooth 99 slips over the top of gear teeth 55 to allow pawl 53 to again return to the position shown in Fig. 4. When control arm 19 is rotated in a clockwise direction, Fig. 5, arm 51 maintains pressure on leg 91 of spring 59 while leg 89 has been released so that knee 93 may operate upon pawl 53 to cause tooth 101 to engage with the gear teeth 55 and thereby provide clockwise rotation of shaft 25. Releasing control 19 again brings the ratchet mechanism components back to the positions shown in Fig. 4 by virtue of the action of arm 51.

The gear drive apparatus 35, which provides fine turning for V.H.F. frequencies and continuous tuning for U.H.F. frequencies, is attached to the outer drive shaft 27. This apparatus is shown comprising the U.H.F. dial 44 having gear teeth 103 formed in the peripheral surface thereof. The turning knob 23 is also provided with gearing to operate upon dial 44 in a manner so as to provide a step down tuning movement which may be approximately 7 to 1. Knob 23 is mounted upon the front of brace 105 formed on bracket 37 by means of rivets 107 to provide a readily accessible customer control.

The rear portions of shafts 25 and 27 are rotatably affixed to one another by means of retaining clip 108, which is disposed in slot 109 and groove 111 provided in outer shaft 27 and inner shaft 25 respectively. An electrical insulating linkage 113 interconnects the end of shaft 25 with the V.H.F. shaft extension 115 extending directly to V.H.F. tuner 13. Accordingly, rotation of control arm 19, ratchet wheel 57 and shaft 25 provides V.H.F. channel selection by imparting movement to linkage 113 and shaft 115. The insulating linkage electrically isolates customer control arm 19 from tuner 13.

The outer control shaft 27 is affixed to yoke 117 by means of the abutting relationship between wire 119 and a flat portion 121 formed on the peripheral surface of shaft 27. Yoke 117 is provided with flaps 123, which are formed to be disposed within slots 125 of electrical insulating plate 127. Rotatable actuating means or pulley 129 is affixed to plate 127 and has an opening 131 formed therein to allow passage of shaft extension 115 therethrough. Retaining ring 151 snaps into groove 153 to maintain extension 115 at a position forward of the front surface of pulley 129. A limit arm 133 is formed on the rear portion of pulley 129 for the purpose of cooperating with stop bar 135 formed upon the housing of V.H.F. tuner 13. Pulley 129 is connected to the tuner by virtue of the engagement between the protrusions 137 formed on tuner sleeve 139 and depressions 141 provided in the pulley. The sleeve is longitudinally positioned relative to tuner 13 by means of retainer 149. Plate 127, limit arm 133 and pulley 129 may be fabricated as a single integral unit of electrical insulating material if desired. Coupling or cord 29 interconnects rotatable actuating means 129 with the U.H.F. pulley 145 to provide operation of U.H.F. tuner 15. A spring 147 is mounted upon pulley 145 to maintain cord 39 under tension in a manner well understood in the art. By means of this arrangement, rotation of the outer shaft 27 causes yoke 117, plate 127 and pulley 129 to rotate. This movement provides fine V.H.F. tuning through sleeve 139 in addition to providing U.H.F. tuning through coupling 29, pulley 145 and tuner shaft 146. Stop bar 135 limits the travel of sleeve 139 and pulley 145 to approximately one revolution in either direction by intercepting arm 133 on pulley 129.

A tuning mechanism of the type provided herein facilitates the fabrication of compact, economical and efficient means for tuning a plurality of electrical devices which are positioned remote from the operator controls in addition to providing means for switching through a plurality of frequencies by a simple movement of the operator controls.

Although one embodiment of the invention has been shown and described, it will be apparent to those skilled in the art that various changes and modifications may be made therein without departing from the scope of the invention as defined by the appended claim.

What is claimed is.

A mechanism for tuning two electrical devices comprising a bracket, rotatable inner and outer concentric drive shafts mounted at one end to said bracket and continuously connected at the other end thereof directly to the first of said devices, a first tuning control for imparting rotation to the inner drive shaft to provide coarse tuning of said first device, a second tuning control for imparting rotation to the outer drive shaft to provide fine tuning of said first device, said second tuning control including a gear of a given diameter mounted on said outer drive shaft and a geared knob mounted on said bracket having a diameter less than said given diameter meshing with said gear, rotatable means connected to the second of said devices, a coupling continuously interconnecting the outer one of said shafts with said rotatable means to provide tuning of said second device upon rotation of said geared knob, and means for electrically insulating said tuning controls from said devices.

References Cited in the file of this patent

UNITED STATES PATENTS

| | | |
|---|---|---|
| 2,579,659 | Fisher | Dec. 25, 1951 |
| 2,720,117 | Kennedy | Oct. 11, 1955 |
| 2,756,599 | Sperber | July 31, 1956 |
| 2,761,321 | Bieze | Sept. 4, 1956 |
| 2,785,574 | Krahulu | Mar. 19, 1957 |
| 2,810,292 | Kennedy | Oct. 22, 1957 |